United States Patent
Yamada

(10) Patent No.: US 8,957,425 B2
(45) Date of Patent: Feb. 17, 2015

(54) SEMICONDUCTOR DEVICE AND METHOD FOR MANUFACTURING SEMICONDUCTOR DEVICE

(75) Inventor: Atsushi Yamada, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 13/315,682

(22) Filed: Dec. 9, 2011

(65) Prior Publication Data

US 2012/0211761 A1    Aug. 23, 2012

(30) Foreign Application Priority Data

Feb. 21, 2011    (JP) .................. 2011-035117

(51) Int. Cl.
*H01L 29/772*    (2006.01)
*H01L 29/66*    (2006.01)
*H01L 29/778*    (2006.01)
*H01L 21/28*    (2006.01)
*H01L 29/20*    (2006.01)

(52) U.S. Cl.
CPC ...... *H01L 29/7787* (2013.01); *H01L 29/66462* (2013.01); *H01L 21/28264* (2013.01); *H01L 29/2003* (2013.01)
USPC  257/76; 257/194; 257/E29.242; 257/E29.246; 257/E21.409

(58) Field of Classification Search
USPC ........... 257/194, E29.246–E29.253, E21.403, 257/E21.407
See application file for complete search history.

(56) References Cited

U.S. PATENT DOCUMENTS

| 2002/0083959 | A1 | 7/2002 | Morita et al. |
| 2003/0160265 | A1 | 8/2003 | Inoue et al. |
| 2003/0213975 | A1* | 11/2003 | Hirose et al. ................. 257/194 |
| 2004/0183090 | A1 | 9/2004 | Kitaoka et al. |
| 2005/0106895 | A1 | 5/2005 | Lin et al. |
| 2007/0087492 | A1 | 4/2007 | Yamanaka |
| 2009/0121775 | A1 | 5/2009 | Ueda et al. |
| 2010/0012977 | A1* | 1/2010 | Derluyn et al. ............... 257/194 |
| 2010/0140721 | A1 | 6/2010 | Takagi |
| 2012/0126246 | A1* | 5/2012 | Takagi ........................... 257/77 |

FOREIGN PATENT DOCUMENTS

| CN | 1264159 A | 8/2000 |
| JP | 2002-359256 A1 | 12/2002 |
| JP | 2004-311869 | 11/2004 |
| JP | 2005-012171 | 1/2005 |
| JP | 2007-19309 A1 | 1/2007 |
| JP | 2008-053581 | 3/2008 |
| JP | 2009-76845 A1 | 4/2009 |
| TW | 200518260 | 6/2005 |

OTHER PUBLICATIONS

Taiwanese Office Action issued for Taiwanese Patent Application No. 100148557 dated Feb. 24, 2012.
(Continued)

*Primary Examiner* — Mamadou Diallo
(74) *Attorney, Agent, or Firm* — Kratz, Quintos & Hanson, LLP

(57) ABSTRACT

A semiconductor device includes: a semiconductor layer disposed above a substrate; an insulating film formed by oxidizing a portion of the semiconductor layer; and an electrode disposed on the insulating film, wherein the insulating film includes gallium oxide, or gallium oxide and indium oxide.

14 Claims, 9 Drawing Sheets

(56) References Cited

OTHER PUBLICATIONS

Chinese Office Action issued for Chinese Patent Application No. 201210003495.4 dated Jan. 24, 2014.

Japanese Office Action Issued for Japanese Patent Application No. 2011-035117 dated Apr. 20, 2014.

U.S. Office Action for U.S. Appl. No. 14/221,489 dated Oct. 14, 2014.

Japanese Office Action dated Nov. 18, 2014, for Japanese Patent Application No. 2011-035117 with English translation.

* cited by examiner

US 8,957,425 B2

SEMICONDUCTOR DEVICE AND METHOD FOR MANUFACTURING SEMICONDUCTOR DEVICE

CROSS-REFERENCE TO RELATED APPLICATIONS

This application claims the benefit of priority from Japanese Patent Application No. 2011-35117 filed on Feb. 21, 2011, the entire contents of which are incorporated herein by reference.

BACKGROUND

1. Field

The embodiments discussed herein relate to a semiconductor device and a method for manufacturing the semiconductor device.

2. Description of Related Art

Materials including GaN, AlN, InN, and a mixed crystal of these materials, which are included in nitride semiconductors, have a wide band-gap and are used in high-output electronic devices, short-wavelength light-emitting devices, and the like. Field-effect transistors (FETs), for example, high electron mobility transistors (HEMTs) are used in high-output-high-efficiency-amplifiers or high-power switching devices, and the like. In an HEMT including an electron supply layer having AlGaN and an electron transit layer having GaN, strain due to a difference in a lattice constant between AlGaN and GaN may occur in AlGaN and piezoelectric polarization may occur. Since a high-concentration two-dimensional electron gas is generated by the piezoelectric polarization, a high-output device may be provided.

For example, related are is disclosed in Japanese Laid-open Patent Publication Nos. 2002-359256, 2007-19309, and 2009-76845.

SUMMARY

According to one aspect of the embodiments, a semiconductor device includes: a semiconductor layer disposed above a substrate; an insulating film formed by oxidizing a portion of the semiconductor layer; and an electrode disposed on the insulating film, wherein the insulating film includes gallium oxide, or gallium oxide and indium oxide.

Additional advantages and novel features of the invention will be set forth in part in the description that follows, and in part will become more apparent to those skilled in the art upon examination of the following or upon learning by practice of the invention.

DESCRIPTION OF EMBODIMENTS

Figure 1:
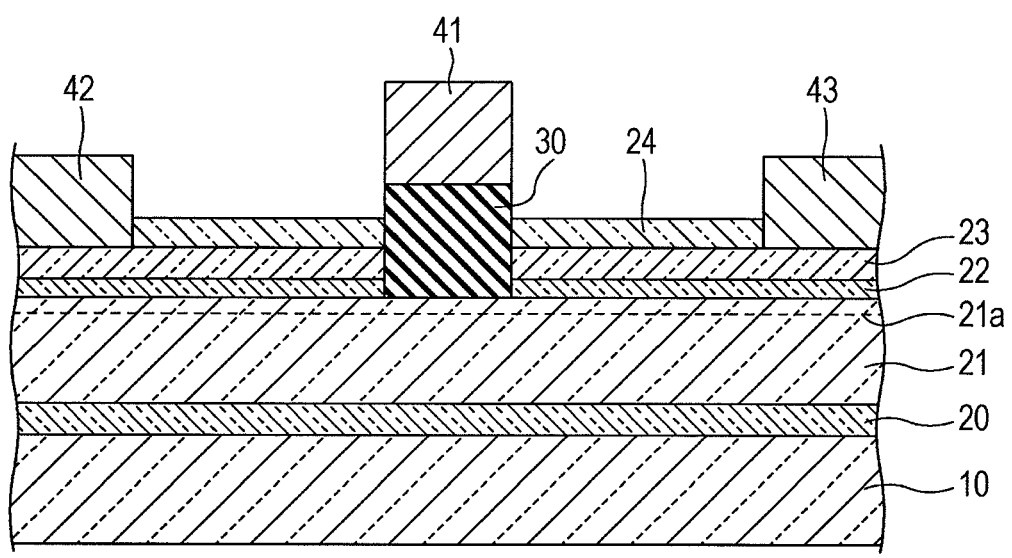
FIG. 1 illustrates an exemplary semiconductor device.

In an HEMT which is used in a high-output-high-efficiency-amplifier, a high-power switching device, or the like, normally-off may be applied thereto, and the HEMT may have a high breakdown voltage. In order to achieve a normally-off operation, a portion of a semiconductor layer located under a gate electrode is removed to form a gate recess. In a gate recess structure, the threshold voltage becomes positive without increasing the resistance between electrodes. In order to obtain a high drain breakdown voltage and a high gate breakdown voltage, a metal insulator semiconductor (MIS) structure including a gate insulating film is used in an FET or HEMT having a lateral structure. The gate recess structure and the MIS structure may be applied to an HEMT including a GaN-based semiconductor material.

In a semiconductor device having the gate recess structure and the MIS structure, a portion of a semiconductor layer formed by epitaxial growth or the like is removed by, for example, etching, and an insulating film may be formed on the etched portion. Consequently, the semiconductor device may be damaged by the etching.

In embodiments, substantially the same components and the like are assigned the same reference numerals, and the description of those components may be omitted or reduced.

FIG. 1 illustrates an exemplary semiconductor device. The semiconductor device illustrated in FIG. 1 may include a transistor called HEMT. The semiconductor device includes a semiconductor layer including an electron transit layer 21, a spacer layer 22, an electron supply layer 23, and a cap layer 24, the semiconductor layer being provided on a buffer layer 20 formed on a substrate 10 corresponding to a semiconductor or the like. The semiconductor layer is formed by epitaxial growth such as metal-organic vapor phase epitaxy (MOVPE). A source electrode 42 and a drain electrode 43 that are coupled to the electron supply layer 23 are provided. An insulating film 30 corresponding to a gate insulating film is provided on a region of the electron transit layer 21 where a gate electrode 41 is formed. The gate electrode 41 is provided on the insulating film 30. The source electrode 42 and the drain electrode 43 may be coupled to the electron transit layer 21. A protective film including an insulator may be provided so as to cover the cap layer 24.

The substrate 10 may be any one of a Si substrate, a SiC substrate, a sapphire ($Al_2O_3$) substrate, and the like. For example, when a Si substrate is used as the substrate 10, the buffer layer 20 may be provided. When a material other than silicon is used as the substrate 10, the buffer layer 20 may not be provided. The electron transit layer 21 may be composed of i-GaN. The spacer layer 22 may be i-AlGaN. The electron supply layer 23 may be composed of n-AlGaN. The cap layer 24 may be an n-GaN. A two-dimensional electron gas (2DEG) 21a is generated on the electron supply layer 23 side of the electron transit layer 21.

The gate electrode 41, the source electrode 42, and the drain electrode 43 may include a metal material. The insulating film 30 corresponding to the gate insulating film is formed by oxidizing the spacer layer 22, the electron supply layer 23, and the cap layer 24. For example, by oxidizing i-AlGaN corresponding to the spacer layer 22, n-AlGaN corresponding to the electron supply layer 23, and n-GaN corresponding to the cap layer 24, $Ga_2O_3$ and $Al_2O_3$ are formed. The $Ga_2O_3$ and $Al_2O_3$ may correspond to the insulating film 30. Alternatively, the electron supply layer 23 and the cap layer 24 may be oxidized. Alternatively, only the cap layer 24 may be oxidized.

The semiconductor layer may include GaN and AlGaN. Alternatively, the semiconductor layer may include a nitride semiconductor such as InAlN or InGaAlN. The insulating film 30 corresponding to the gate insulating film may be $Ga_2O_3$, $In_2O_3$, $Al_2O_3$, and the like formed by oxidizing InAlN and InGaAlN.

FIGS. 2A to 2I illustrate an exemplary a method for producing a semiconductor device.

Figure 2A:
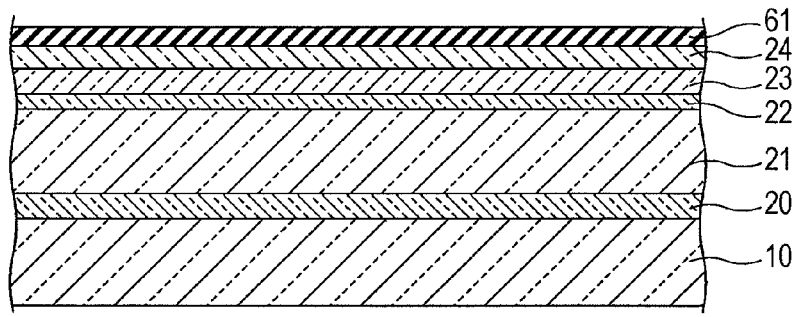
FIGS. 2A to 2I illustrate an exemplary method for producing a semiconductor device.

As illustrated in FIG. 2A, a buffer layer 20 is formed on a substrate 10. A semiconductor layer including, for example, an electron transit layer 21, a spacer layer 22, an electron supply layer 23, and a cap layer 24 is formed on the buffer layer 20 by epitaxial growth such as MOVPE. A silicon nitride (SiN) film 61 for forming a mask is formed on the cap layer 24. The substrate 10 may be a substrate composed of Si, SiC, sapphire ($Al_2O_3$), or the like. The buffer layer 20 for epitaxially growing the electron transit layer 21 and other layers is formed on the substrate 10. The buffer layer 20 may be, for example, an undoped i-AlN layer having a thickness of 0.1 μm. The electron transit layer 21 may be an undoped i-GaN layer having a thickness of 3 μm. The spacer layer 22 may be an undoped i-AlGaN layer having a thickness of 5 nm. The electron supply layer 23 may be an n-$Al_{0.25}Ga_{0.75}N$ layer having a thickness of 30 nm. The electron supply layer 23 is doped with Si serving as an impurity element at a concentration of $5 \times 10^{18}$ cm$^{-3}$. The cap layer 24 may be an n-GaN layer having a thickness of 10 nm. The cap layer 24 is doped with Si serving as an impurity element at a concentration of $5 \times 10^{18}$ cm$^{-3}$. The silicon nitride (SiN) film 61 having a thickness of 200 nm is deposited on the cap layer 24 by plasma enhanced chemical vapor deposition (PECVD).

Figure 2B:
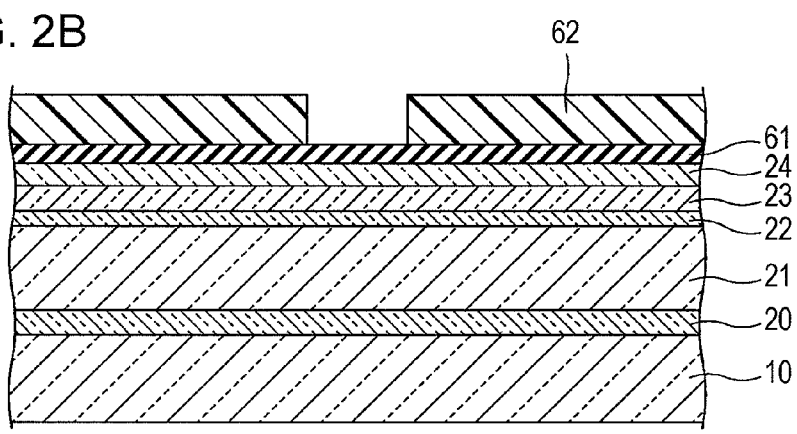

As illustrated in FIG. 2B, a resist pattern 62 is formed on the silicon nitride film 61. For example, a photoresist is applied onto the silicon nitride film 61. The photoresist is exposed by an exposure apparatus and then developed to form the resist pattern 62. The resist pattern 62 may have an opening in a region where an insulating film corresponding to a gate insulating film is to be formed.

Figure 2C:
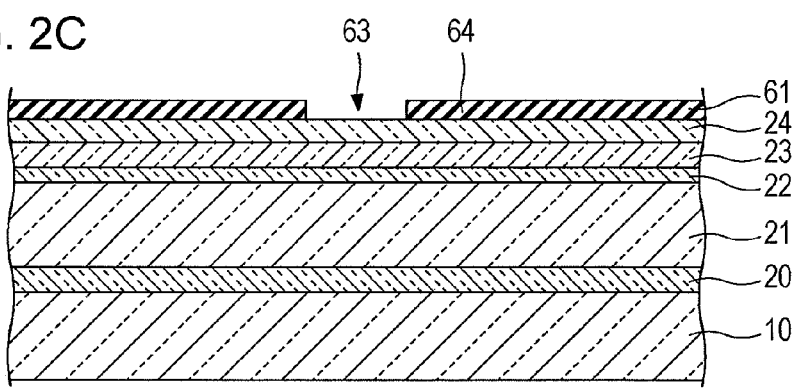

As illustrated in FIG. 2C, the silicon nitride film 61 in a region where the resist pattern 62 is not formed is removed by dry etching such as reactive ion etching (RIE). The resist pattern 62 may also be removed. A mask 64 including the silicon nitride film 61 having an opening 63 is formed. The silicon nitride film 61 is used as the material of the mask 64. Alternatively, other materials that are not easily oxidized may be used.

Figure 2D:
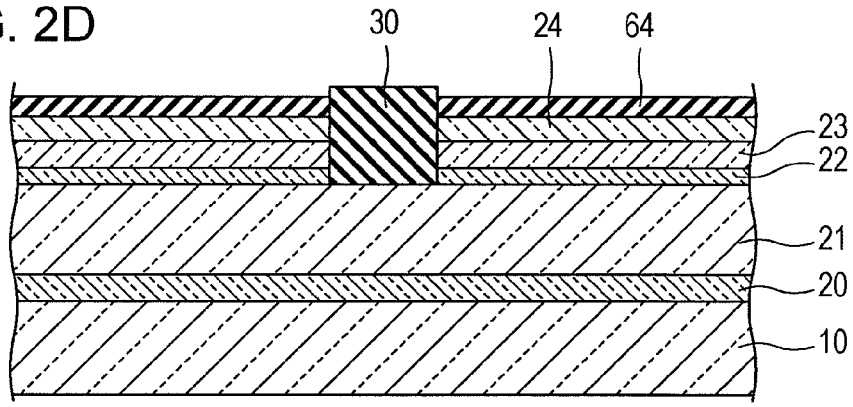

As illustrated in FIG. 2D, the spacer layer 22, the electron supply layer 23, and the cap layer 24 that are exposed in the opening 63 of the mask 64 are oxidized to form an insulating film 30 corresponding to a gate insulating film. For example, the insulating film 30 may be formed by oxidizing the spacer layer 22, the electron supply layer 23, and the cap layer 24 using supercritical water. For example, the silicon nitride film 61 having the opening 63 is placed at a predetermined position in a chamber filled with pure water. The inside of the chamber is set to a high-temperature, high-pressure state, and the pure water in the chamber becomes supercritical water. Since supercritical water has a strong oxidizing power, materials that are oxidized at high temperatures are oxidized at lower temperatures by using supercritical water. For example, GaN and AlGaN are thermally oxidized at a temperature of 1,000° C. or higher. However, the crystal structures of the epitaxially grown semiconductor layers may be broken by heating at such a high temperature. In oxidation with supercritical water, supercritical water at a temperature of 700° C. or lower, for example, about 380° C. is used, and thus a semiconductor layer in a predetermined region that is in contact with supercritical water is oxidized. A nitride semiconductor is oxidized without causing disorder of the crystal structure of the semiconductor layer. The insulating film 30 corresponding to the gate insulating film is formed by oxidizing a part of a semiconductor layer including a nitride semiconductor without degrading characteristics of the semiconductor device.

Figure 3:
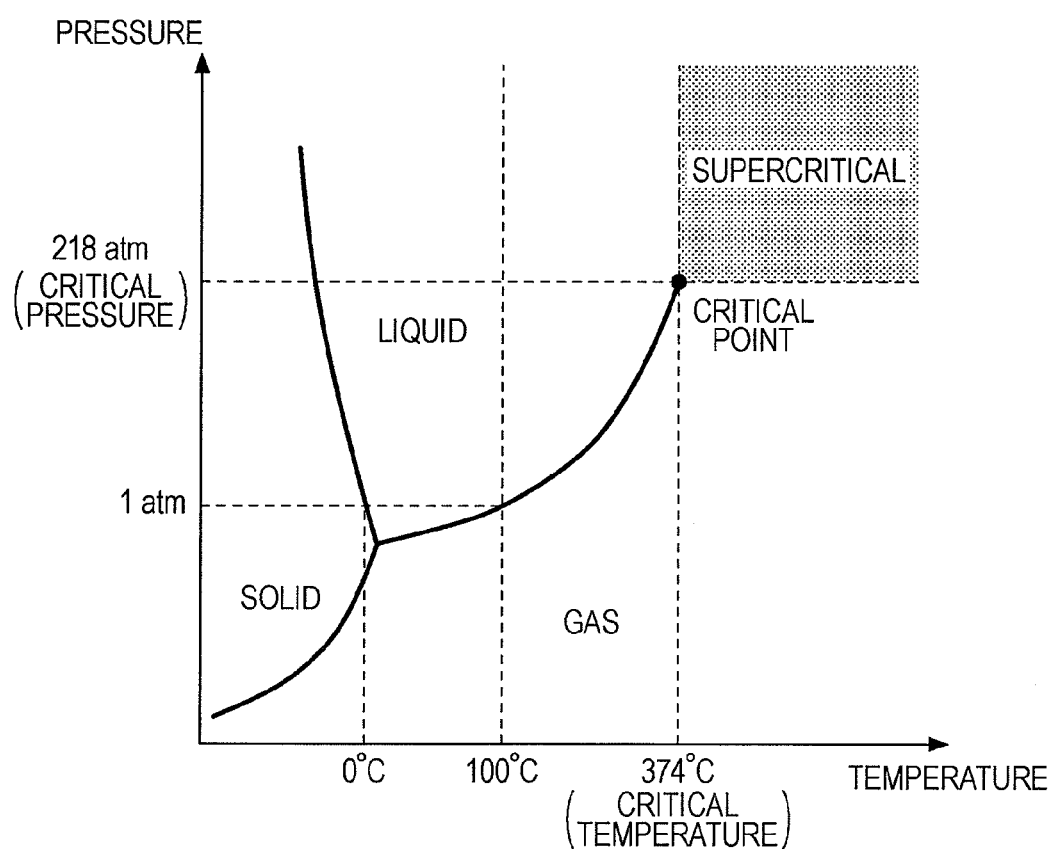
FIG. 3 illustrates an exemplary a characteristic of supercritical water.

FIG. 3 illustrates an exemplary characteristic of supercritical water. The term "supercritical water" refers to water in a state at a temperature of 374° C. or higher and a pressure of 218 atmospheres or more, and refers to, for example, water in a state where gas and liquid are not distinguished from each other. Supercritical water has properties different from those of normal water. The properties of supercritical water may accelerate a chemical reaction. By using supercritical water, GaN and AlGaN, which are oxidized at high temperatures, are oxidized at relatively low temperatures. For example, by oxidizing the spacer layer 22 corresponding to i-AlGaN, the electron supply layer 23 corresponding to n-AlGaN, or the cap layer 24 corresponding to n-GaN, the insulating film 30 corresponding to $Ga_2O_3$ and $Al_2O_3$ is formed. The spacer layer 22, the electron supply layer 23, and the cap layer 24 are oxidized by using supercritical water at a temperature of 700° C. or lower, for example, 550° C. or lower to form the insulating film 30. Subcritical water, which is in a state at a temperature and a pressure slightly lower than those of the critical point, also has a strong oxidizing power. The oxidizing power of water in a state close to subcritical water is also relatively strong. Accordingly, GaN and AlGaN may be oxidized at low temperatures by using water that is in a liquid state at a temperature higher than 100° C., as in the case of supercritical water. For example, a semiconductor layer including a nitride semiconductor may be oxidized at a temperature equal to or lower than a temperature at which the source electrode 42 and the drain electrode 43 are brought into ohmic contact with each other.

A recess is formed in the oxidized region formed by oxidizing the spacer layer 22, the electron supply layer 23, and the cap layer 24, and in addition, an insulating film is formed in the recess. A process of forming the recess and a process of forming the insulating film are performed contemporaneously, and thus the manufacturing process may be simplified.

Similarly, in a semiconductor device including a nitride semiconductor other than GaN and AlGaN, an oxidized film corresponding to an insulting film may be formed. For example, also in a semiconductor device in which a nitride semiconductor such as InAlN or InGaAlN is used as a semiconductor layer, an insulating film including $In_2O_3$, $Ga_2O_3$, and $Al_2O_3$ may be formed by oxidation using supercritical water or the like.

Figure 2E:
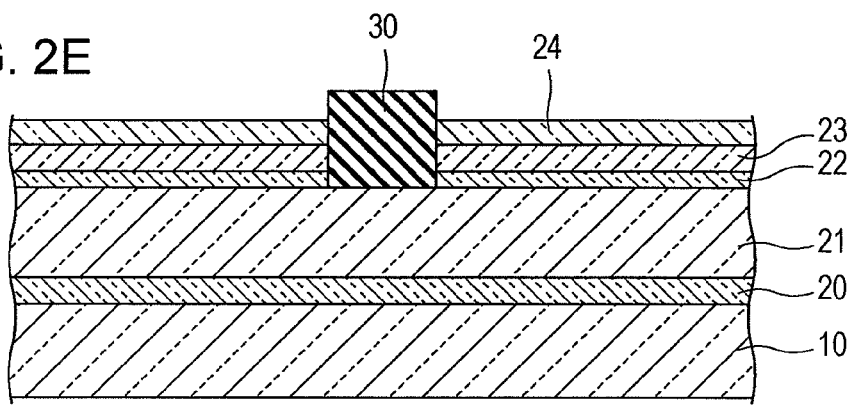

As illustrated in FIG. 2E, the silicon nitride film 61 is removed. For example, the silicon nitride film 61 is removed by wet etching using hot phosphoric acid.

Figure 2F:
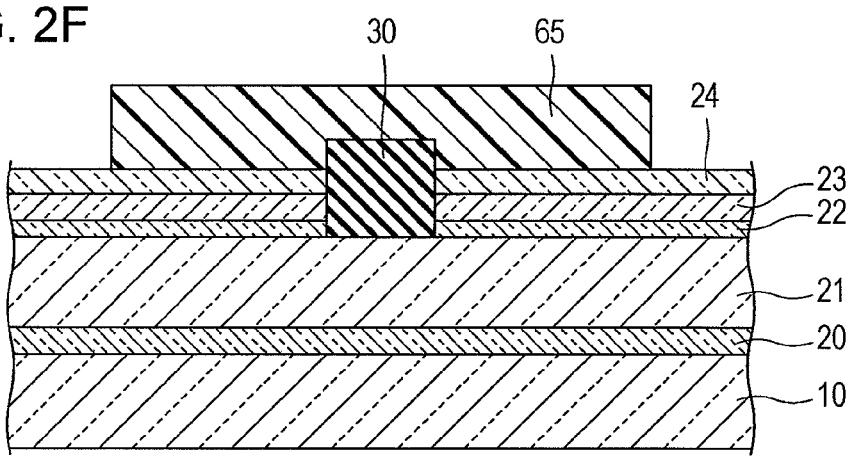

As illustrated in FIG. 2F, a resist pattern 65 is formed. For example, a photoresist is applied onto the surface of the cap layer 24. The photoresist is exposed by an exposure apparatus and then developed to form the resist pattern 65. The resist pattern 65 has openings in regions where a source electrode 42 and a drain electrode 43 are to be formed. Before the formation of the resist pattern 65, an element isolation region (not illustrated) may be formed. A resist pattern (not illustrated) having an opening in the element isolation region is formed. Dry etching using a chlorine-based gas or ion implantation is conducted in the opening to form the element isolation region. The resist pattern (not illustrated) used for forming the element isolation region is removed.

Figure 2G:
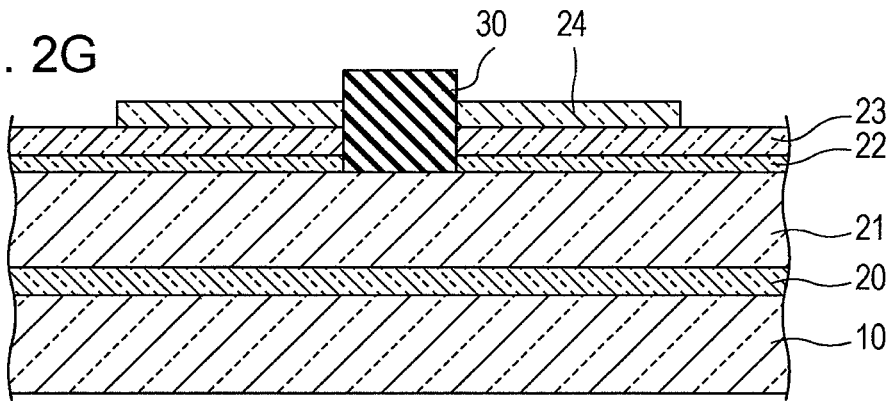

As illustrated in FIG. 2G, dry etching such as RIE is conducted using a chlorine-based gas to remove the cap layer 24 in the openings of the resist pattern 65. The resist pattern 65 is also removed by an organic solvent or the like. Thus, the cap layer 24 is removed in the regions where the source electrode 42 and the drain electrode 43 are to be formed.

Figure 2H:
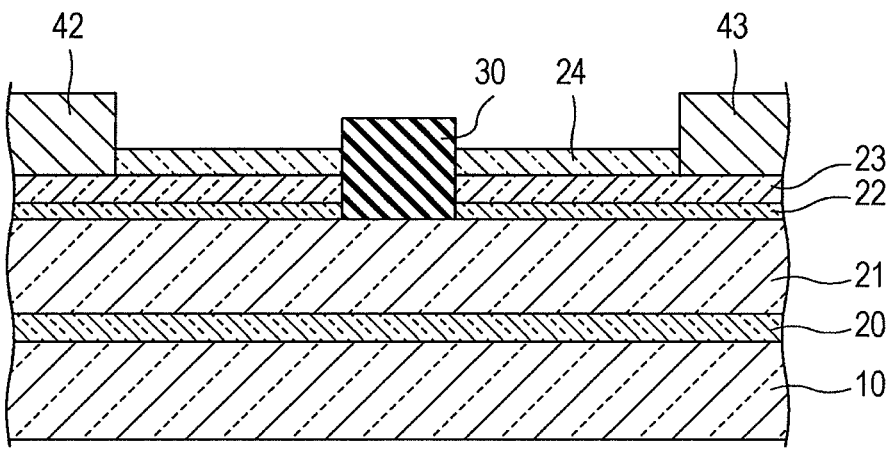

As illustrated in FIG. 2H, the source electrode 42 and the drain electrode 43 are formed. For example, a resist pattern (not illustrated) having openings in the regions where the source electrode 42 and the drain electrode 43 are to be formed is formed. A photoresist is applied onto the surface on which the cap layer 24 is formed. The photoresist is exposed by an exposure apparatus and then developed to form the resist pattern. A metal film, for example, a Ta film having a thickness of about 20 nm or an Al film having a thickness of about 200 nm is formed over the entire surface by vacuum deposition or the like. The metal film deposited on the resist pattern is then removed by lift-off using an organic solvent. The metal film in regions where the resist pattern is not formed is used as the source electrode 42 and drain electrode 43 which are disposed on the electron supply layer 23 and includes Ta/Al. The metal film, which includes Ta and is in contact with the cap layer 24, is heat-treated in a nitrogen atmosphere at a temperature in the range of 400° C. to 700° C., for example, at 550° C., thereby establishing ohmic contact between the source electrode 42 and the drain electrode 43. In the case where the ohmic contact is established without heat treatment, the heat treatment may not be conducted.

Figure 2I:
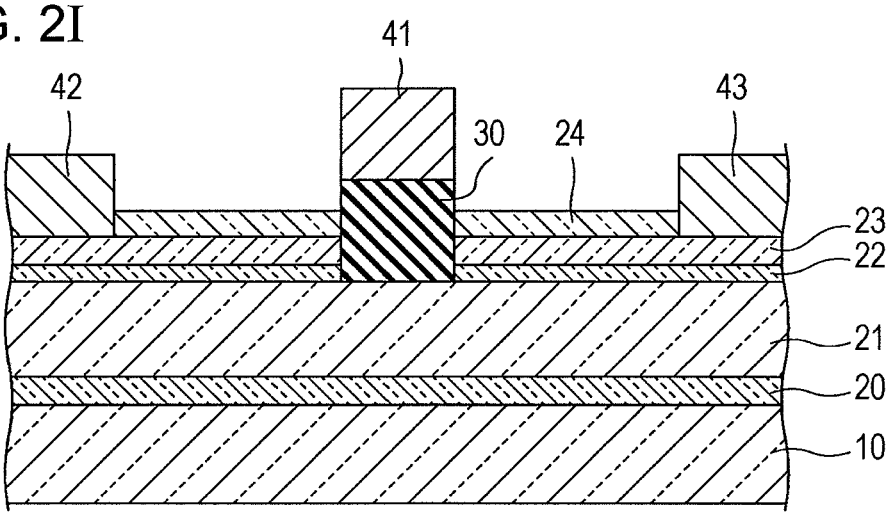

As illustrated in FIG. 2I, a gate electrode 41 is formed. For example, a resist pattern (not illustrated) having an opening in a region where the gate electrode 41 is to be formed is formed. A photoresist is applied onto the surface on which the cap layer 24 is formed. The photoresist is exposed by an exposure apparatus and then developed to form the resist pattern. A metal film, for example, a Ni film having a thickness of about 40 nm or a Au film having a thickness of about 400 nm is formed over the entire surface by vacuum deposition. The metal film deposited on the resist pattern is then removed by lift-off using an organic solvent. The metal film in a region where the resist pattern is not formed is used as the gate electrode 41 which is disposed on the insulating film 30 and includes Ni/Au. Heat treatment or the like may then be conducted as required.

Figure 4:
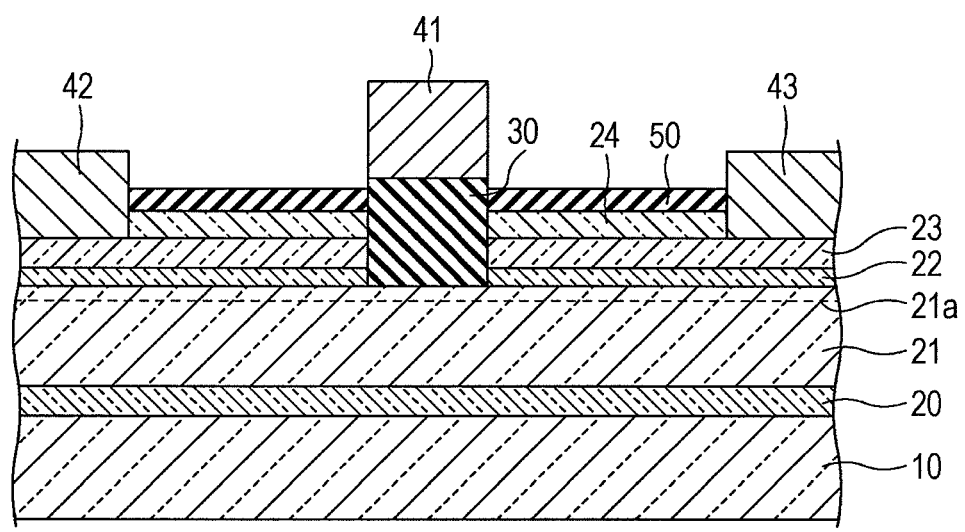
FIG. 4 illustrates an exemplary a semiconductor device.

FIG. 4 illustrates an exemplary semiconductor device. As illustrated in FIG. 4, a protective film 50 may be formed in regions where the cap layer 24 is exposed. For example, the protective film 50 may include an insulator. For example, the protective film 50 may be formed by depositing an aluminum oxide film or a silicon nitride film by plasma atomic layer deposition (ALD) or the like.

Figure 5:
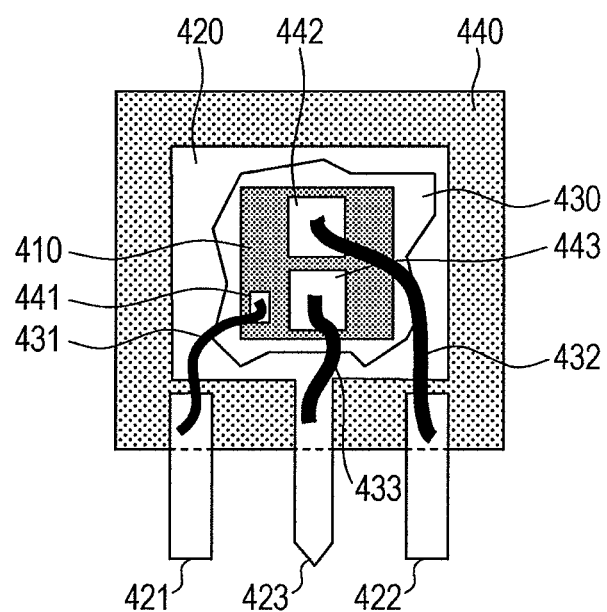
FIG. 5 illustrates an exemplary a discrete-packaged semiconductor device.

FIG. 5 illustrates an exemplary discrete-packaged semiconductor device. The semiconductor device illustrated in FIG. 1 or 4 may be discrete-packaged. FIG. 5 schematically illustrates the inside of the discrete-packaged semiconductor device. Therefore, the arrangement of electrodes etc. illustrated in FIG. 5 may be different from the structure illustrated in FIG. 1 or 4.

For example, the semiconductor device illustrated in FIG. 1 or 4 is cut by dicing or the like to form a semiconductor chip 410 of HEMT including a GaN-based semiconductor material. The semiconductor chip 410 is fixed on a lead frame 420 with a die attaching agent 430 such as solder.

A gate electrode 441 is coupled to a gate lead 421 with a bonding wire 431. A source electrode 442 is coupled to a source lead 422 with a bonding wire 432. A drain electrode 443 is coupled to a drain lead 423 with a bonding wire 433. The bonding wires 431, 432, and 433 may include a metal material such as Al. The gate electrode 441 may be a gate electrode pad, and is coupled to, for example, the gate electrode 41. The source electrode 442 may be a source electrode pad, and is coupled to, for example, the source electrode 42.

The drain electrode 443 may be a drain electrode pad, and is coupled to, for example, the drain electrode 43.

A resin seal is performed by a transfer molding method using a molding resin 440, thus producing a semiconductor device in which the HEMT including the GaN-based semiconductor material is discrete-packaged.

Figure 6:
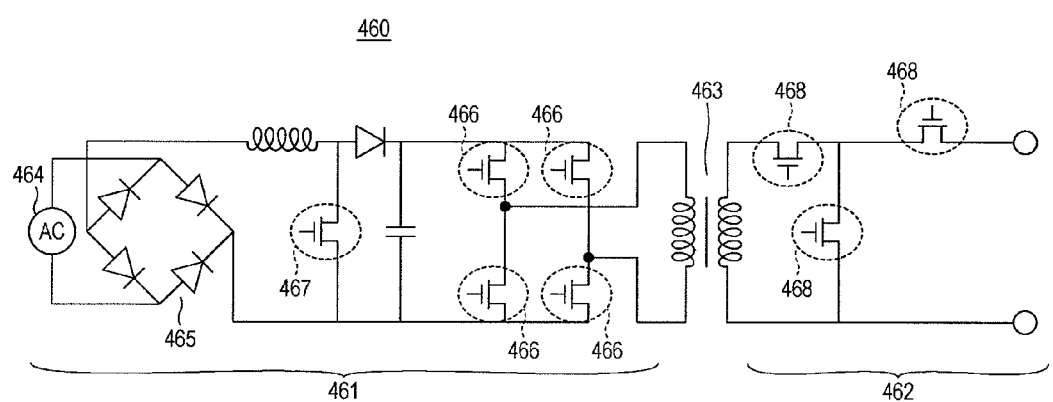
FIG. 6 illustrates an exemplary power supply device.

FIG. 6 illustrates an exemplary power supply device. A power supply device 460 illustrated in FIG. 6 includes a high-voltage primary side circuit 461, a low-voltage secondary side circuit 462, and a transformer 463 provided between the primary side circuit 461 and the secondary side circuit 462. The primary side circuit 461 includes an AC power supply 464, for example, a bridge rectifier circuit 465, and a plurality of switching elements, for example, four switching elements 466 and one switching element 467, etc. The secondary side circuit 462 includes a plurality of switching elements, for example, three switching elements 468. The semiconductor device illustrated in FIG. 1 or 4 may be used as the switching elements 466 and 467 of the primary side circuit 461. The switching elements 466 and 467 of the primary side circuit 461 may each be a normally-off semiconductor device. The switching elements 468 of the secondary side circuit 462 may each be a metal-insulator-semiconductor field-effect transistor (MISFET) containing silicon.

Figure 7:
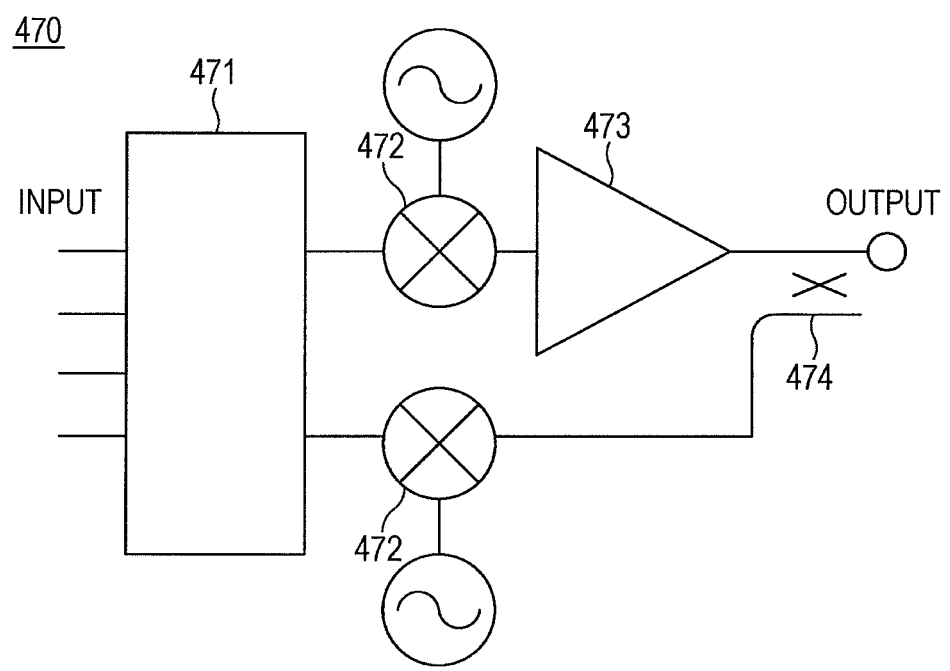
FIG. 7 illustrates an exemplary a high-frequency amplifier.

FIG. 7 illustrates an exemplary high-frequency amplifier. A high-frequency amplifier 470 illustrated in FIG. 7 may be applied to a power amplifier for a base station of mobile phones. The high-frequency amplifier 470 includes a digital pre-distortion circuit 471, mixers 472, a power amplifier 473, and a directional coupler 474. The digital pre-distortion circuit 471 compensates for non-linear distortion in an input signal. One of the mixers 472 mixes the input signal in which the non-linear distortion is compensated for with an alternating current signal. The power amplifier 473 amplifies the input signal mixed with the alternating current signal. The power amplifier 473 illustrated in FIG. 7 may include the semiconductor device illustrated in FIG. 1 or 4. The directional coupler 474 performs, for example, monitoring of an input signal and an output signal. For example, based on switching of a switch, the other mixer 472 may mix an output signal with an alternating current signal and transmit the mixed signal to the digital pre-distortion circuit 471. Since the semiconductor device illustrated in FIG. 1 or 4 is used in the power amplifier 473, a power supply device and an amplifier may be provided at a low cost.

Example embodiments of the present invention have now been described in accordance with the above advantages. It will be appreciated that these examples are merely illustrative of the invention. Many variations and modifications will be apparent to those skilled in the art.

The invention claimed is:

1. A semiconductor device comprising:
a semiconductor layer disposed above a substrate;
an insulating film formed in the semiconductor layer so that a sidewall of the insulating film is in contact with the semiconductor layer; and
a source electrode and a drain electrode provided so as to be in contact with at least one of a first semiconductor layer and a second semiconductor layer which are included in the semiconductor layer,
wherein the insulating film includes gallium oxide, or gallium oxide and indium oxide,
wherein the semiconductor layer includes a third semiconductor layer and a fourth semiconductor layer and a bottom surface of the insulating film is in contact with the fourth semiconductor layer.

2. The semiconductor device according to claim 1, wherein the insulating film further includes aluminum oxide.

3. The semiconductor device according to claim 1, wherein the semiconductor layer includes a nitride semiconductor.

4. The semiconductor device according to claim 3, wherein the semiconductor layer includes a nitride of at least one element selected from the group consisting of Ga, Al, and In.

5. The semiconductor device according to claim 1, further comprising, bringing the portion of the semiconductor layer into contact with supercritical water or water at a temperature of higher than 100° C. and 700° C. or lower to form the insulating film.

6. The semiconductor device according to claim 1, wherein the first semiconductor layer includes GaN.

7. The semiconductor device according to claim 1, wherein the second semiconductor layer includes AlGaN.

8. The semiconductor device according to claim 1, further comprising: a protective film including an insulator and disposed above the semiconductor layer.

9. The semiconductor device according to claim 1, wherein the insulating film is formed by oxidizing a portion of the semiconductor layer.

10. The semiconductor device according to claim 1, wherein a portion of the insulating film is buried in the semiconductor layer.

11. An electronic apparatus comprising:
an input circuit;
an output circuit; and
a semiconductor device provided between the input circuit and the output circuit,
the semiconductor device includes;
a semiconductor layer disposed above a substrate;
an insulating film formed in the semiconductor layer so that a sidewall of the insulating film is in contact with the semiconductor layer; and
a source electrode and a drain electrode provided so as to be in contact with at least one of a first semiconductor layer and a second semiconductor layer which are included in the semiconductor layer,
wherein the insulating film includes gallium oxide, or gallium oxide and indium oxide,
wherein the semiconductor layer includes a third semiconductor layer and a fourth semiconductor layer and a bottom surface of the insulating film is in contact with the fourth semiconductor layer.

12. An electronic apparatus according to claim 11, wherein the electronic apparatus includes one of a power supply device and an amplifier.

13. The electronic apparatus according to claim 11, wherein the insulating film is formed by oxidizing a portion of the semiconductor layer.

14. The electronic apparatus according to claim 11, wherein a portion of the insulating film is buried in the semiconductor layer.

* * * * *